(12) United States Patent
Navid

(10) Patent No.: US 10,892,920 B2
(45) Date of Patent: Jan. 12, 2021

(54) RECEIVER/TRANSMITTER CO-CALIBRATION OF VOLTAGE LEVELS IN PULSE AMPLITUDE MODULATION LINKS

(71) Applicant: Rambus Inc., Sunnyvale, CA (US)

(72) Inventor: Reza Navid, San Jose, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 16/611,472

(22) PCT Filed: Aug. 2, 2018

(86) PCT No.: PCT/US2018/045046
§ 371 (c)(1),
(2) Date: Nov. 6, 2019

(87) PCT Pub. No.: WO2019/032379
PCT Pub. Date: Feb. 14, 2019

(65) Prior Publication Data
US 2020/0145261 A1    May 7, 2020

Related U.S. Application Data

(60) Provisional application No. 62/542,149, filed on Aug. 7, 2017.

(51) Int. Cl.
*H04L 25/03* (2006.01)
*H04L 27/01* (2006.01)
(Continued)

(52) U.S. Cl.
CPC ........ *H04L 25/03267* (2013.01); *H04L 27/01* (2013.01); *H04L 27/04* (2013.01); *H04L 27/08* (2013.01); *H04L 27/2679* (2013.01)

(58) Field of Classification Search
CPC ... H04L 25/03267; H04L 27/01; H04L 27/04; H04L 27/08; H04L 27/2679; H04L 27/06
See application file for complete search history.

(56) References Cited

U.S. PATENT DOCUMENTS 8,750,406 B2 * 6/2014 Pan ..................... H04L 25/4917
375/287
8,804,809 B2 * 8/2014 Raphaeli ........... H04L 25/03057
375/233

(Continued)

OTHER PUBLICATIONS

PCT International Search Report and Written Opinion, PCT/US2018/045046, dated Oct. 3, 2018, 17 pages.

*Primary Examiner* — Kenneth T Lam
(74) *Attorney, Agent, or Firm* — Fenwick & West LLP

(57) ABSTRACT

A driver circuit of a PAM-N transmitting device transmits a PAM-N signal via a communication channel, wherein N is greater than 2, and the PAM-N signal has N signal levels corresponding to N symbols. A PAM-N receiving device receives the PAM-N signal. The PAM-N receiving device generates distortion information indicative of a level of distortion corresponding to inequalities in voltage differences between the N signal levels. The PAM-N receiving device transmits to the PAM-N transmitting device the distortion information indicative of the level of the distortion. The PAM-N transmitting device receives the distortion information. The PAM-N transmitting device adjusts one or more drive strength parameters of the driver circuit of the PAM-N transmitting device based on the distortion information.

20 Claims, 8 Drawing Sheets

(51) Int. Cl.
*H04L 27/04* (2006.01)
*H04L 27/08* (2006.01)
*H04L 27/26* (2006.01)

(56) References Cited

U.S. PATENT DOCUMENTS

| | | |
|---|---|---|
| 10,447,510 B1 * | 10/2019 | Rengarajan ............. H04L 27/06 |
| 2002/0153936 A1 | 10/2002 | Zerbe |
| 2005/0134307 A1 | 6/2005 | Stojanovic et al. |
| 2006/0188043 A1 * | 8/2006 | Zerbe .................... H04W 52/20 375/346 |
| 2013/0094561 A1 * | 4/2013 | Raphaeli ........... H04L 25/03057 375/233 |
| 2013/0243070 A1 * | 9/2013 | Ito ........................... H04L 27/01 375/233 |
| 2014/0153620 A1 | 6/2014 | Longo et al. |
| 2014/0169429 A1 * | 6/2014 | Ran .......................... H04L 1/24 375/226 |
| 2015/0071651 A1 | 3/2015 | Asmanis et al. |
| 2018/0248577 A1 * | 8/2018 | Hossain ................. H04B 1/123 |

\* cited by examiner

RECEIVER/TRANSMITTER CO-CALIBRATION OF VOLTAGE LEVELS IN PULSE AMPLITUDE MODULATION LINKS

BACKGROUND

In high speed data transmission systems, pulse amplitude modulation (PAM) signaling is used to carry data from a transmitting device to a receiving device. While a 2-level PAM (PAM-2) signaling system is inherently linear, a multi-level PAM signaling system (PAM-N) with more than 2 levels can suffer from non-linearity distortion. Different components within the transmitter and receiver can introduce non-uniform distribution of PAM target levels in the PAM signal. These unwanted voltage offsets from the multi-PAM levels can affect the ability of the receiver to correctly recover data from the signal.

BRIEF DESCRIPTION OF THE DRAWINGS

The teachings of the embodiments herein can be readily understood by considering the following detailed description in conjunction with the accompanying drawings.

Figure (FIG. 1 is an illustration of a system with an example receiver/transmitter calibration architecture, according to an embodiment of the present disclosure.

DETAILED DESCRIPTION OF EMBODIMENTS

Figure 1:
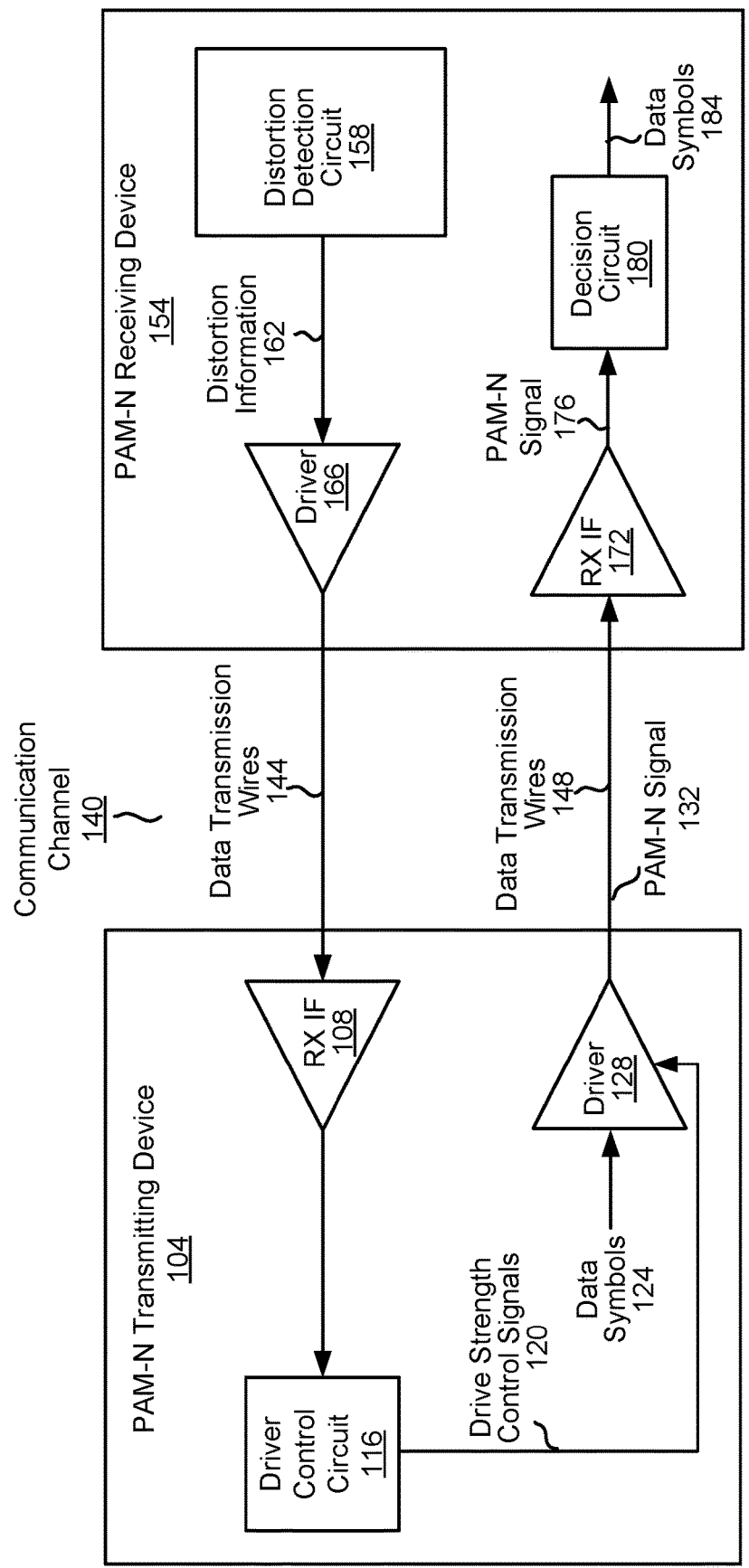

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

An embodiment of the present disclosure relates to a PAM-N receiving device, including a receiver interface circuit to receive a PAM-N signal from a PAM-N transmitting device via a communication channel, wherein N is greater than 2 and the PAM-N signal has N signal levels for N symbols. A circuit generates distortion information indicative of a level of distortion corresponding to inequalities in voltage differences between the N signal levels. A driver circuit transmits the distortion information indicative of the level of the distortion to the PAM-N transmitting device.

In one embodiment, the PAM-N receiving device further includes a decision feedback equalizer, wherein the distortion information is generated by determining a first threshold error level used to generate error information for adaptation of tap weights of the decision feedback equalizer when targeting a first symbol of the N symbols. A second threshold error level used to generate error information for adaptation of the tap weights of the decision feedback equalizer when targeting a second symbol of the N symbols is determined, wherein the distortion information is generated from the first threshold error level and the second threshold error level.

In one embodiment, the distortion information is generated by identifying a first amount of ISI during transitions from a first symbol of the N symbols. A second amount of ISI is identified during transitions from a second symbol of the N symbols, wherein the distortion information is generated from the first amount of ISI and the second amount of ISI.

In one embodiment, the circuit identifies the first amount of ISI during transitions from the first symbol to a third symbol of the N symbols. The second amount of ISI is identified during transitions from the second symbol to a fourth symbol of the N symbols.

In one embodiment, the circuit includes an eye scanning circuit to detect vertical eye openings for the PAM-N signal, wherein the distortion information is generated from the vertical eye openings.

In one embodiment, the circuit detects when a predetermined pattern is present in the PAM-N signal and generates the distortion information responsive to the predetermined pattern being present.

In one embodiment, the receiver interface circuit of the PAM-N receiving device includes an analog front end circuit that applies analog signal conditioning to the PAM-N signal. The circuit generates the distortion information indicative of the level of the distortion corresponding to the inequalities in the voltage differences between the N signal levels in the PAM-N signal at an output of the analog front end circuit.

In one embodiment, a PAM-N transmitting device includes a driver circuit to transmit a PAM-N signal via a communication channel to a PAM-N receiving device, wherein N is greater than 2, and the PAM-N signal has N signal levels corresponding to N symbols. A receiver interface circuit receives distortion information indicating a level of distortion corresponding to inequalities in voltage differences between the N signal levels at the PAM-N receiving device. A driver control circuit adjusts one or more drive strength parameters of the driver circuit based on the distortion information.

In one embodiment, the driver circuit of the PAM-N transmitting device generates the PAM-N signal using a predetermined pattern.

In one embodiment, the driver circuit of the PAM-N transmitting device generates the PAM-N signal using a pseudorandom or scrambled pattern.

In one embodiment, the driver circuit of the PAM-N transmitting device includes a first driver corresponding to a first symbol bit and a second driver corresponding to a second symbol bit, wherein the driver control circuit adjusts the one or more drive strength parameters based on the distortion information such that a ratio of a first drive strength of the first driver to a second drive strength of the second driver is adjusted.

In one embodiment, the one or more drive strength parameters of the driver circuit of the PAM-N transmitting device are adjusted to minimize the inequalities in the voltage differences.

In one embodiment, the driver control circuit adjusts the one or more drive strength parameters to match a peak power constraint of the driver circuit.

Receiver/Transmitter Co-Calibration Architecture for a PAM-N Link

FIG. 1 is an illustration of a system having a receiver/transmitter calibration architecture 100, according to an embodiment of the present disclosure. The architecture 100 includes a PAM-N transmitting device 104 and a PAM-N receiving device 154. The PAM-N transmitting device 104 may be an integrated circuit (IC) while the PAM-N receiving device 154 may be a different IC. Pulse-amplitude modulation (PAM), may be a form of signal modulation where a data symbol 124 is encoded in the amplitude of a series of signal pulses by the PAM-N transmitting device 104. It is an analog pulse modulation scheme in which the amplitudes of a train of carrier pulses are varied according to the sample value of the data symbol 124.

Demodulation is performed by detecting the amplitude level of the PAM-N signal 132 at every single period. PAM-N refers to PAM with N signal levels. For example, some Ethernet standards use five-level PAM modulation (PAM-5) and some use PAM with 16 discrete levels (PAM-16).

The PAM-N transmitting device 104 includes a driver circuit 128 that encodes multi-bit data symbols 124 into a PAM-N signal 132 and transmits the PAM-N signal 132 via a communication channel 140 over data transmission wires 148 to the PAM-N receiving device 154, wherein N is greater than 2, and the PAM-N signal 132 has N signal levels corresponding to N types of data symbols. In one embodiment, the PAM-N signal 132 is a PAM-4 signal. The PAM-N signal 132 can be transmitted as a differential signal over the data transmission wires 148 (only one line is shown in FIG. 1, but the line can represent a pair of wires 148). In other embodiments the PAM-N signal 132 can be a single ended signal transmitted over a single ended wire. In other embodiments, the PAM-N signal 132 may use different coding schemes in which multiple bits are encoded and transmitted over multiple lines to trade-off between differential and single-ended signaling.

The PAM-N transmitting device 104 includes a receiver interface circuit 108 to receive distortion information 162, via the communication channel 140 over data transmission wires 144. The distortion information 162 indicates a level of non-linear distortion caused by inequalities in voltage differences between the N signal levels at the PAM-N receiving device 154. The PAM-N transmitting device 104 includes a driver control circuit 116 that receives the distortion information 162 and generates one or more drive strength control signals 120 for adjusting one or more drive strength parameters of the driver circuit 128 based on the distortion information 162.

The PAM-N receiving device 154 includes a receiver interface circuit 172 to receive the PAM-N signal 132 from the PAM-N transmitting device 104 via the communication channel 140. The receiver interface circuit 172 can be an analog front end (AFE) circuit that applies analog signal conditioning to the PAM-N signal 132 to generate a PAM-N signal 176 at the output of the receiver interface circuit 172. An example of the receiver interface circuit 172 will be described in detail below with reference to FIG. 2.

The PAM-N signal 176 at the output of the receiver interface circuit 172 is used as input to a decision circuit 180 that makes a decision on the data symbols 184 encoded in the PAM-N signal 176. The decision circuit 180 can include a data slicer circuit that compares samples of the PAM-N signal 176 to one or more decision thresholds. In an alternative embodiment, an analog to digital converter (ADC) (not shown) may convert analog voltage samples of the PAM-N signal 176 into digital samples. The digital samples are then digitally processed by a digital signal processor to identify data symbols 184.

The PAM-N receiving device 154 includes a distortion detection circuit 158 to detect non-linear distortion caused by inequalities in voltage differences between the N signal levels of the PAM-N signal 176, and to generate distortion information 162 indicative of a level of the distortion. The distortion can be detected in the PAM-N signal 176 at the output of the interface circuit 172, which is the input to the decision circuit 180. In embodiments that include an ADC (not shown), the distortion can be detected in the PAM-N signal at the output of the interface circuit 172 which is the input to the ADC.

The PAM-N receiving device 154 includes a driver circuit 166 to transmit the distortion information 162 indicative of a level of the distortion to the PAM-N transmitting device 104. The distortion information 162 may be transmitted in packets reserved for physical layer communications. The PAM-N transmitting device 104 uses the distortion information 162 to adjust drive strength parameters of the driver 128. The drive strength parameters are adjusted until the inequalities in voltage differences between the N signal levels of the PAM-N signal are minimized or eliminated. Thus, distortion introduced by the receiver interface 172 can be accounted for by pre-adjusting the drive strength of the driver 128 at the transmitting device 104.

Receiver Interface Circuit of the PAM-N Receiving Device

Figure 2:
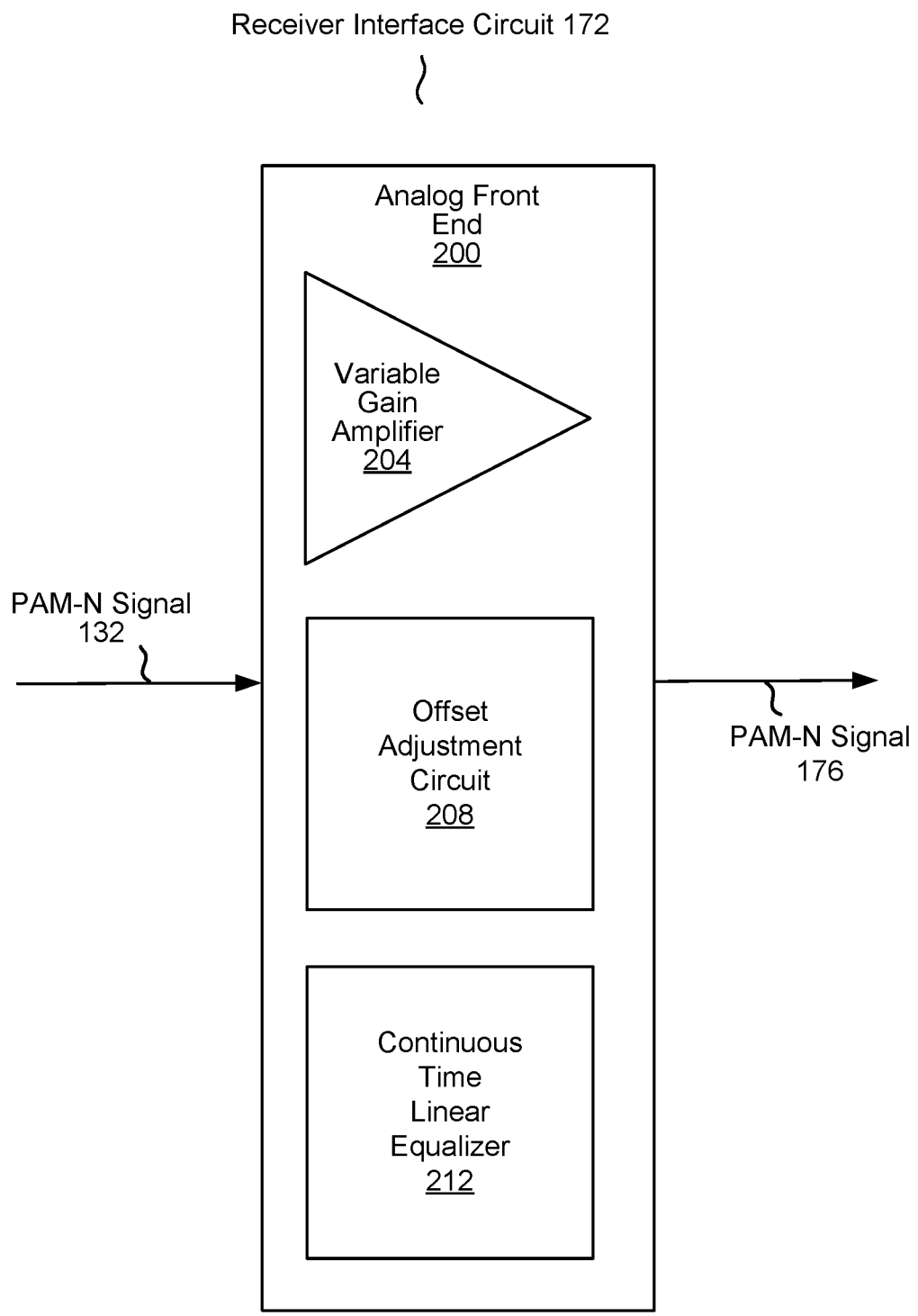
FIG. 2 is an illustration of an example receiver interface circuit of the PAM-N receiving device of FIG. 1 according to an embodiment of the present disclosure.

FIG. 2 is an illustration of the example receiver interface circuit 172 of the PAM-N receiving device 154 of FIG. 1, according to an embodiment of the present disclosure. The receiver interface circuit 172 includes an analog front end (AFE) circuit 200 that applies analog signal conditioning to the PAM-N signal 132. The components of the AFE circuit 200 may operate in a non-linear manner which results in inequalities in voltage differences between the N signal levels in the PAM-N signal. The distortion detection circuit 158, illustrated with reference to FIG. 1 above, detects distortion corresponding to inequalities in the voltage differences between the N signal levels in the PAM-N signal 176 at an output of the AFE circuit 200.

The AFE 200 portion of the receiver 172 applies analog signal processing to the PAM-N Signal 132 to generate PAM-N Signal 176 at an output node of the AFE 200. The AFE 200 may include a variable gain amplifier 204 that has a variable gain that amplifies the PAM-N signal 132 to generate the PAM-N signal 176.

The AFE 200 may include an offset adjustment circuit 208 that corrects a direct current (DC) voltage offset of the various stages of AFE 200 to generate the suitable PAM-N signal 176 for the following stage. The AFE 200 may include a continuous time linear equalizer (CTLE) circuit 212 that applies linear equalization to the PAM-N signal 132 to generate the PAM-N signal 176.

Different configurations of the variable gain amplifier 204, the offset adjustment circuit 208, and the CTLE 212 are possible and the CTLE may be placed ahead of the other two components or at the end in the signal processing flow. In other embodiments, the AFE 200 may also have other circuits such as discrete- or continuous-time feed forward equalization (FFE) components.

Ideal PAM-N Eye and PAM-N Eye with Level Distortion

Figure 3:
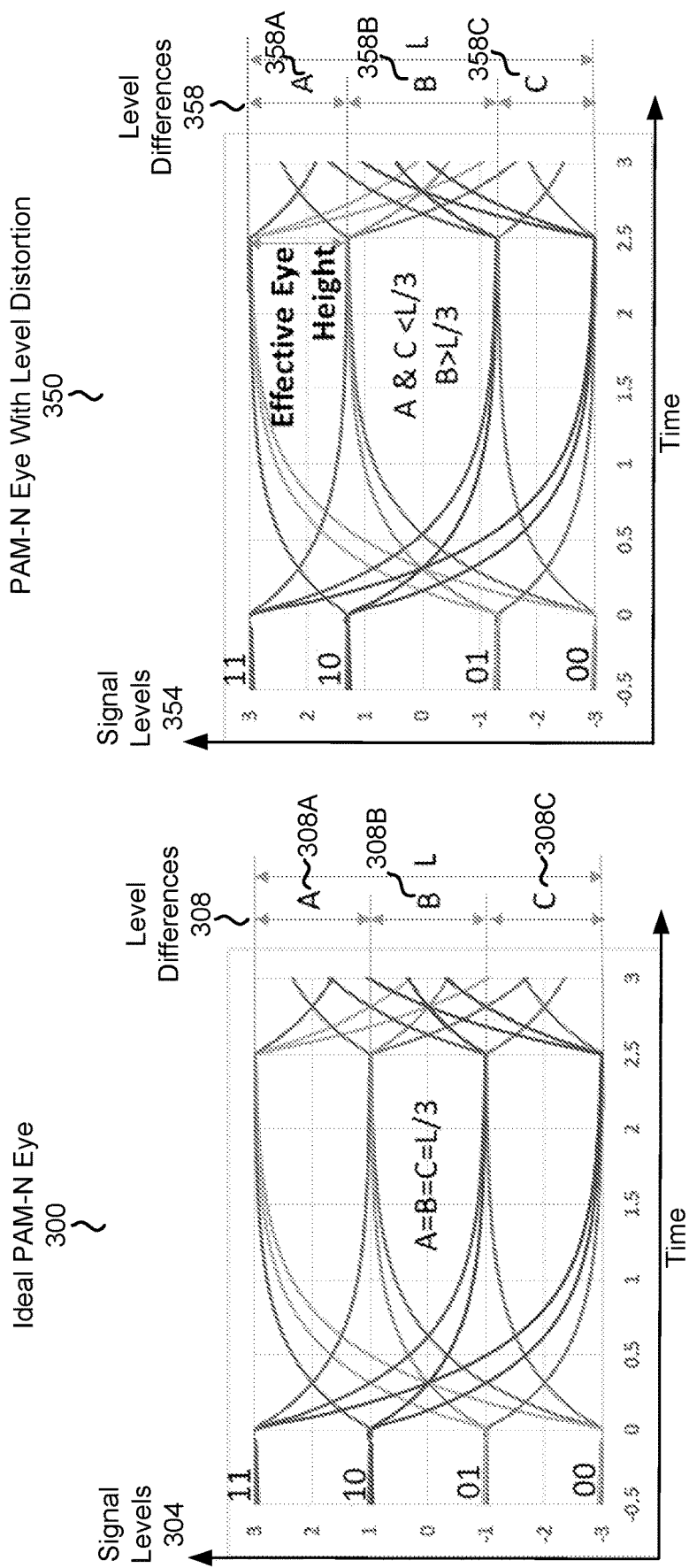
FIG. 3 is an illustration of example waveforms depicting an idea PAM-N eye diagram and a PAM-N eye diagram with level distortion, according to an embodiment of the present disclosure.

FIG. 3 is an illustration of example waveforms depicting an ideal PAM-N eye diagram 300 and a PAM-N eye diagram 350 with level distortion, according to an embodiment of the present disclosure. The PAM-N eye diagram 300 represents an oscilloscope display in which the PAM-N signal 176 from the receiver interface circuit 172 is repetitively sampled and applied to the vertical axis (signal levels 304), while the data rate is used to trigger the horizontal sweep (time axis). It is a synchronized superposition of different realizations of the signal of interest (e.g. the PAM-N signal 176) viewed within a particular signaling interval.

The ideal PAM-N eye 300 plots the four different analog voltage levels 304 for the four symbol values 00, 01, 10, and 11 of the signal 176. The three level differences 308 in the analog voltage levels 304 (after they rise/fall and have settled on their steady state voltage levels) are represented by 308A, 308B, and 308C. Difference 308A represents the voltage difference between the analog voltage levels for symbol values 11 and 10. Difference 308B represents the voltage difference between the analog voltage levels for symbol values 10 and 01. Difference 308C represents the voltage difference between the analog voltage levels for symbol values 01 and 00. Example analog voltage levels for the signal levels 304 are illustrated and described in detail below with reference to FIG. 6.

In an ideal situation, the level differences 308A, 308B and 308C equal each other. As shown in the ideal PAM-N eye 300, level difference 308A, level difference 308B and level difference 308C are all equal to 2 V. However, in practice, the driver 128 and/or the analog front end 200 (and also the channel 140 itself) may operate in a non-linear manner, which causes these level differences 308 to be different from each other. This distortion is illustrated in the PAM-N eye with level distortion 350.

Nonlinearity distortion in the analog voltage level differences 358 between the N signal levels 354 is illustrated in the PAM-N eye diagram with level distortion 350. The PAM-N eye diagram 350 plots the four different analog voltage levels 354 for the four symbol values 00, 01, 10, and 11 of the signal 176. The three level differences 358 in the analog voltage levels 354 are represented by 358A, 358B, and 358C. Difference 358A represents the voltage difference between the analog voltage levels for symbol values 11 and 10. In this particular case, difference 358A is less than difference 358B, which represents the voltage difference between the analog voltage levels for symbol values 10 and 01. Difference 358C represents the voltage difference between the analog voltage levels for values 01 and 00 and is less than difference 358B. The three level differences 358 are not equal to each other causing distortion in the PAM-N eye 350.

In one embodiment, the receiving device 154 provides distortion information 162 indicative of a level of the distortion corresponding to these inequalities in the voltage differences 358 between the N signal levels in the PAM-N signal 176. The transmitting device 104 can then adjust the drive strength parameters of the driver 128 to minimize this distortion such that the voltages differences 358 are closer to the ideal voltage differences 308.

Driver Circuit of the PAM-N Transmitting Device

Figure 4:
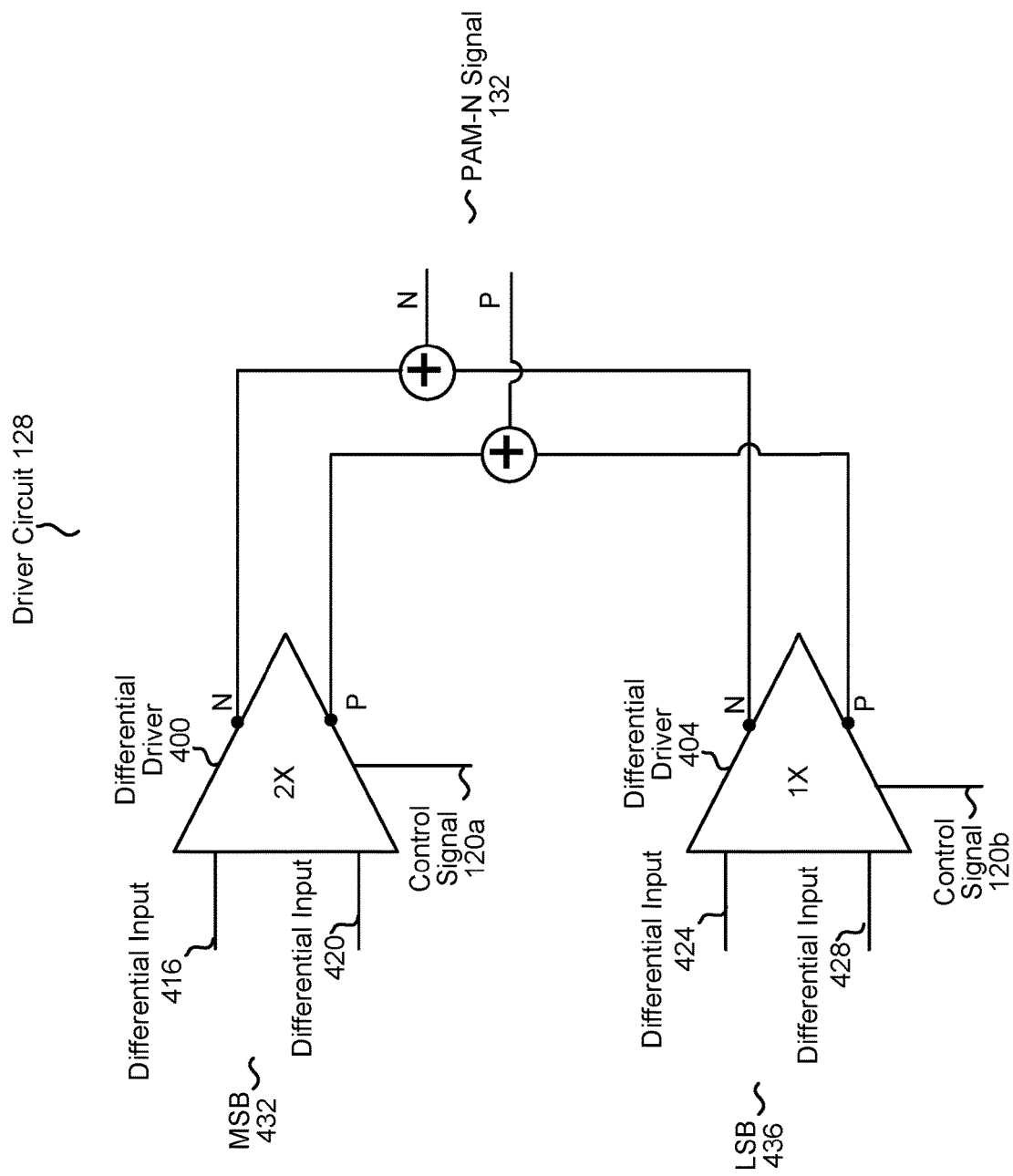
FIG. 4 is an illustration of an example driver circuit of the PAM-N transmitting device of FIG. 1, according to an embodiment of the present disclosure.

FIG. 4 is an illustration of an example driver circuit 128 of the PAM-N transmitting device 104 of FIG. 1, according to an embodiment of the present disclosure. The driver circuit 128 converts bits of a data symbol into a voltage waveform that can be propagated down the channel 140.

In the case of a PAM-4 driver, the driver circuit 128 may include two differential drivers 400 and 404. The value of N equals 4 in the example driver circuit illustrated in FIG. 4. The driver circuit may be similarly designed for larger values of N using a larger number of differential drivers similar to 400 and 404. The two differential input terminals to the differential driver 400 are 416 and 420. The input terminals 416 and 420 carry signals representing the most significant bit (MSB) 432 in a two-bit data symbol. The MSB 432 is the bit position in the 2-bit binary number, e.g., 01, having the greater weight. The drive strength control signal 120a from the driver control circuit 116 of FIG. 1 adjusts a drive strength parameter affecting the drive strength of the differential driver 400. The input terminals 424 and 428 carry signals representing the least significant bit (LSB) 436 in the two-bit data symbol. The LSB 436 is the bit position in the 2-bit binary number, e.g., 01, having the lesser weight. The drive strength control signal 120b from the driver control circuit 116 of FIG. 1 adjusts a drive strength parameter affecting the drive strength of the differential driver 404.

In one embodiment, the differential drivers 400 and 404 may be current mode drivers, and the drive strength control signals 120 may control their drive strength. A current mode driver typically uses Norton-equivalent parallel termination and generally contains transistors that operate in the saturation region of the I-V curve. Current mode drivers are used in high performance serial links, e.g., communication channel 140, as a result of the high output common-mode keeping the current source saturated. The driver control circuit 116, illustrated in FIG. 1, receives the distortion information 112 and generates the two separate drive strength control signals 120a and 120b for controlling the currents of the current sources in the differential drivers 400 and 404. As the drive strength parameters change, the driver control circuit 116 may cause one current source to increase its current while causing the other current source to decrease its current. This causes output voltage of the differential driver 400 to change.

In one embodiment, the drive strengths of drivers 400 and 404 may be adjusted in a manner that complies with a peak power constraint requirement for the driver circuit 128. The peak power constraint specifies the amount of power a data transmission system can safely consume, and can influence reliability. In some embodiments, the peak power may be limited by the peak voltage rating of the data transmission wires 148 and their characteristic impedance. The peak power constraint specification may include the length of a duty cycle and average power constraint.

In an embodiment, the differential drivers 400 and 404 may be voltage mode drivers, and drive strength control signals 120 may control their drive strength. A voltage-mode driver may have multiple drive segments and the number of active drive segments that are turned on determines the drive strength of the driver.

The differential outputs of the drivers 400 and 404 are combined to generate a combined differential signal 132 including two complementary signals. The outputs of the drivers 400 and 404 are cross-wired such that the combined differential signal 132 is approximately equal to the positive differential input pair (P) minus the negative differential input pair (N).

The MSB driver 400 has substantially two times the drive strength of the LSB driver 404. The drive strength of the MSB driver 400 can be adjusted independently of the drive strength of the LSB driver 404. If there are inequalities between the voltage differences 358A, 358B, 358C as shown in FIG. 3, the ratio between the drive strength of the MSB driver 400 and the drive strength of the LSB driver 404 can be adjusted to minimize these inequalities. The driver control circuit 116 determines, from the distortion information 162, how to adjust the ratio of the drive strength of the MSB driver 400 to the LSB driver 404. In the case of a PAM-4 driver, if the distortion information 162 indicates that level difference 358A and 358C (which are equal by construction) are smaller than level difference 358B, this means the drive strength of the LSB driver 404 is not high enough when compared to the drive strength of MSB driver 400. As a result, the driver control circuit 116 may increase the drive strength of LSB driver 404 while reducing the drive strength of MSB driver 400. Conversely, if the distortion information 162 indicates that level difference 358A and 358C are larger than level difference 358B, this means the drive strength of the LSB driver 404 is too high when compared to the drive strength of MSB driver 400. As a result, the driver control circuit 116 may reduce the drive strength of LSB driver 404 while increasing the drive strength of MSB driver 400. The correction loop may operate in a "bang-bang" fashion, in which a fixed small correction, in the direction dictated by the distortion information 162, is applied in each step.

Distortion Detection Circuit Using Eye Scanning

Figure 5:
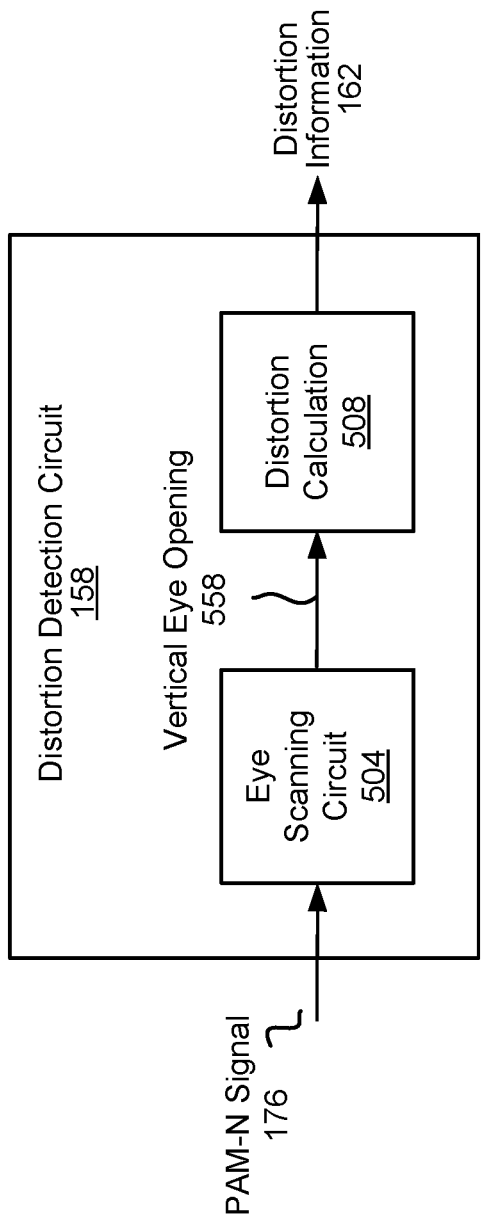
FIG. 5 is an illustration of an example distortion detection circuit of the PAM-N receiving device of FIG. 1, according to an embodiment of the present disclosure.

FIG. 5 is an illustration of an example distortion detection circuit 158 of the PAM-N receiving device 154 of FIG. 1, according to an embodiment of the present disclosure. In this embodiment, eye scanning is used to detect distortions in the PAM-N signal 176. The distortion detection circuit 158 includes an eye scanning circuit 504 to detect vertical eye openings for the PAM-N signal 176 and to generate vertical eye opening information 558 describing the height of the vertical eye openings. The distortion information is generated from the vertical eye opening information 558 as illustrated and described above with reference to FIG. 3.

The interior region of the eye patterns shown in FIG. 3 is called the eye opening. There are three eye openings in the eye diagram 350 in FIG. 3. The distortion detection circuit 158 measures the vertical height of the three eye openings at a particular time within the data eye diagram 350. The relationship between the three eye openings may be equivalent to the relationship between level differences 358A, 358B and 358C. In one embodiment, the eye scanning circuit can determine the vertical eye openings with a comparator that compares the PAM-N signal 176 to a reference voltage. The reference voltage is adjusted while monitoring the output of the comparator until the output of the comparator indicates that the vertical boundary of a data eye opening is reached. The vertical eye opening information 558 can be determined for all data eyes of the data eye 350, or it can be determined for only a subset of the data eyes such as the intermediate data eye between symbols 01 and 10 and the upper data eye between symbols 10 and 11.

The distortion calculation circuit 508 calculates an amount of distortion from the vertical eye opening information 558 and then outputs this calculation as the distortion information 162. For example, the upper or lower data eye opening (the eye between the 10 and 11 data lines or between the 00 and 01 data lines) may be compared to the middle data eye opening (the eye between the 01 and 10 data lines). If the upper or lower eye openings are larger than the middle eye opening, this is an indication that the level differences 358A and 358C are larger then the level difference 358B. Conversely, if the upper and lower eye openings are smaller than the middle eye opening, this is an indication that that the level differences 358A and 358C are smaller then the level difference 358B. This information is output as distortion information 162. To the first order, the ratio of the upper and lower eyes to the middle eye is also the same as the ratio of the level differences 358A and 358C to the level difference 358B. This information my also be included in the distortion information 162.

Detecting Distortion in a PAM-N Signal Based on ISI

Figure 6:
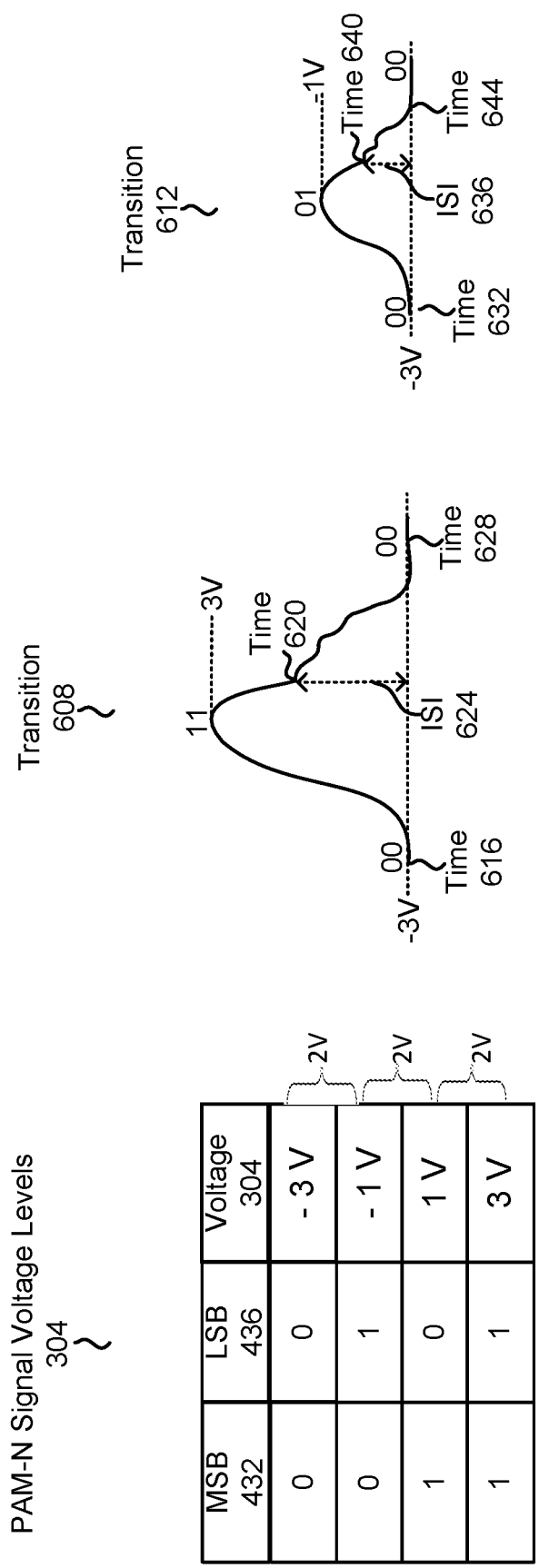
FIG. 6 illustrates an example method of detecting distortion in a PAM-N signal based on estimation of intersymbol interference (ISI), according to an embodiment of the present disclosure.

FIG. 6 illustrates an example method of detecting distortion in the PAM-N signal 176 based on estimation of intersymbol interference (ISI), according to an embodiment of the present disclosure. The method can be performed by the distortion detection circuit 158. ISI is a form of distortion of the signal 176 in which one symbol interferes with subsequent symbols, making the communication less reliable. ISI may be caused by multipath propagation or the frequency response of a channel causing successive symbols to "blur" together.

FIG. 6 illustrates the relationship between the data symbols (MSB 432 and LSB 436) to the ideal analog voltage levels 304 of the PAM-N signal 176. For the symbol 00, the MSB 432 is 0, the LSB 436 is 0, and the analog voltage level 304 of the PAM-N signal 176 should ideally be −3 V. For the symbol 01, the MSB 432 is 0, the LSB 436 is 1, and the analog voltage level 304 of the PAM-N signal 176 should ideally be −1 V. For the symbol 10, the MSB 432 is 1, the LSB 436 is 0, and the analog voltage level 304 of the PAM-N signal 176 should ideally be 1 V. For the symbol 11, the MSB 432 is 1, the LSB 436 is 1, and the analog voltage level 304 of the PAM-N signal 176 should ideally be 3 V. The difference between the signal levels 304 for the digital values 00 and 01, denoted by 308C in FIG. 3, should ideally be equal to (−1−−3) V or 2 V. The difference between the signal levels 304 for the digital values 01 and 10, denoted by 308B in FIG. 3, should ideally be equal to (−1−1) V or 2 V. The difference between the signal levels 304 for the digital values 10 and 11, denoted by 308A in FIG. 3, should ideally be equal to (3−1) V or 2 V. Therefore, the three level differences 308 should be equal to each other. When there is nonlinearity distortion in the PAM-N signal 176, e.g., in the eye diagram 350 in FIG. 3, the three level differences 358 do not equal each other. In this event, the level differences 358 will not equal 2 V each.

In the embodiment illustrated in FIG. 6, the distortion detection circuit 158 of FIG. 1 detects the distortion caused by the inequality in the voltage differences 358 between the N signal levels 308 by identifying a first amount of ISI during transitions from a first symbol of the N symbols, and identifying a second amount of ISI during transitions from a second symbol of the N symbols, wherein the distortion information is generated from the first amount of ISI and the second amount of ISI.

In the transition 608 illustrated in FIG. 6, the PAM-N signal 176 transitions from the symbol 00 at time 616 to the symbol 11 (the first symbol) to the symbol 00 (a third symbol) at time 628. The second change from the symbol 11 to the symbol 00 is the transition of interest here, especially at time 620. The ideal signal level 304 for symbol 11 is 3 V, and for symbol 00 is −3 V. Therefore, the transition 608 should have an ideal output voltage swing of (3−−3) V or 6 V. Due to ISI from the previous symbol 11, when transitioning from the symbol 11 to the symbol 00, the signal experiences a first amount of ISI 624 at time 620 instead of smoothly transitioning to the symbol 00.

In the transition 612, the PAM-N signal 176 transitions from the symbol 00 at time 632 to a symbol 01 (the second symbol) to the symbol 00 (a fourth symbol) at time 644. The second change from the symbol 01 to the symbol 00 is the transition of interest here, especially at time 640. The ideal signal level 304 for symbol 01 is −1 V, and for symbol 00 is −3 V. Therefore, the transition 608 should have an ideal output voltage swing of (−1−−3) V or 2 V, which is one third of the voltage swing experienced in transition 608. Due to ISI from the previous symbol 01, when transitioning from the symbol 01 to the symbol 00, the signal experiences a second amount of ISI 636 at time 640 instead of smoothly transitioning to the symbol 00.

The distortion detection circuit 158 may determine the distortion in the signal levels from the ratio of the amount of ISI 624 to the amount of ISI 636. The amount of ISI 624 is determined from the transition 608 of symbol 11 at 3 V to symbol 00 at −3 V. This represents a 6 V output voltage swing in the PAM-N signal level 304. The amount of ISI 636 is determined from the transition 612 of symbol 01 at −1 V to symbol 00 at −3 V. This represents a 2 V output voltage swing in the PAM-N signal level 304. Because the ratio of swing in voltage levels of the two transitions is 6:2 or 3, therefore, the ratio between the second amount of ISI 636 and the first amount of ISI 624 should equal 1/3. In embodiments, the two raw ISI values may be generated by the distortion detection circuit 158. In embodiments, the determined ratio of the two amounts of ISI may be generated by the distortion detection circuit 158. In embodiments, the deviation of the determined ISI ratio from the ideal ISI ratio (1/3) is output as distortion information 162.

In the case of the PAM-4 signal of FIG. 6, if the ISI value 636 is smaller than one third of the ISI value 624, this is an indication that the level difference 358C is smaller than the level difference 358B. Conversely, if the ISI value 636 is larger than one third of the ISI value 624, this is an indication that the level difference 358C is larger than the level difference 358B. The distortion detection circuit 158 may generate distortion information 162 using this information. The ISI values 636 and 624 maybe calculated using DFE error level adaptation with the addition of data filtering. Data filtering can refer to analyzing the data decisions (e.g., data symbols 184) to identify the presence of a target data symbol sequence and then obtaining the ISI values when those target data symbol sequences are present.

In practice different combinations of the first, second, third, and fourth symbol may be used to calibrate the receiver/transmitter based on the analog voltage differences between symbols. For example, a transition from 10 (1 V) to 00 (−3 V), i.e., an output swing of 4 V, should experience double the ISI that a transition from 01 (−1 V) to 00 (−3 V), i.e., an output swing of 2 V, does. Therefore, the distortion is detected by identifying the first amount of ISI 624 during transitions from a first symbol 11 of the N symbols, and identifying a second amount of ISI 636 during transitions from a second symbol 01 of the N symbols, wherein the distortion information is generated from the first amount of ISI 624 and the second amount of ISI 636. Further, the distortion detection circuit 158 detects the distortion caused by the inequality in the voltage differences 358 between the N signal levels 308 by identifying the first amount of ISI 624 during transitions to a third symbol 00 of the N symbols, and identifying the second amount of ISI 636 during transitions to a fourth symbol 00 of the N symbols.

The driver circuit 128 of FIG. 1 may generate the PAM-N signal 132 using a predetermined pattern specifically identified for use in calibrating the receiver/transmitter system. In an embodiment, a predetermined pattern may be used in a confirmatory way to verify that a given sequence of digital values produces expected results during transmission. The predetermined pattern may be produced in a focused or systematic way by using repetitions of certain transitions, or by using high-volume randomized automated tests to generate the PAM-N signal 132 using pseudorandom or scrambled patterns. A pseudorandom pattern exhibits statistical randomness while being generated by an entirely deterministic causal process. The benefit of this approach is that it is easier to produce than a genuinely random pattern, and has the benefit that it can be used again and again to produce the same results, which is useful for testing and calibrating the receiver/transmitter. In an embodiment, a scrambled pattern such as that corresponding to a scrambled idle pattern may be used.

In an embodiment, the distortion detection circuit 158 detects when a predetermined pattern is present in the PAM-N signal 176 and detects the distortion caused by inequality in the voltage differences 358 between the N signal levels 354 responsive to the predetermined pattern being present. For example, each time the distortion detection circuit 158 detects a transition from symbol values 11 to 00, it may store the amount of ISI 624 detected. Each time the distortion detection circuit 158 detects a transition from symbol values 01 to 00, it may store the amount of ISI 636 detected. Over an interval of time, the distortion detection circuit 158 determines the amount of distortion by aggregating the ISI values in response to the predetermined pattern of transitions.

Detecting Distortion in a PAM-N Signal Based on DFE Error Level Adaptation

Figure 7:
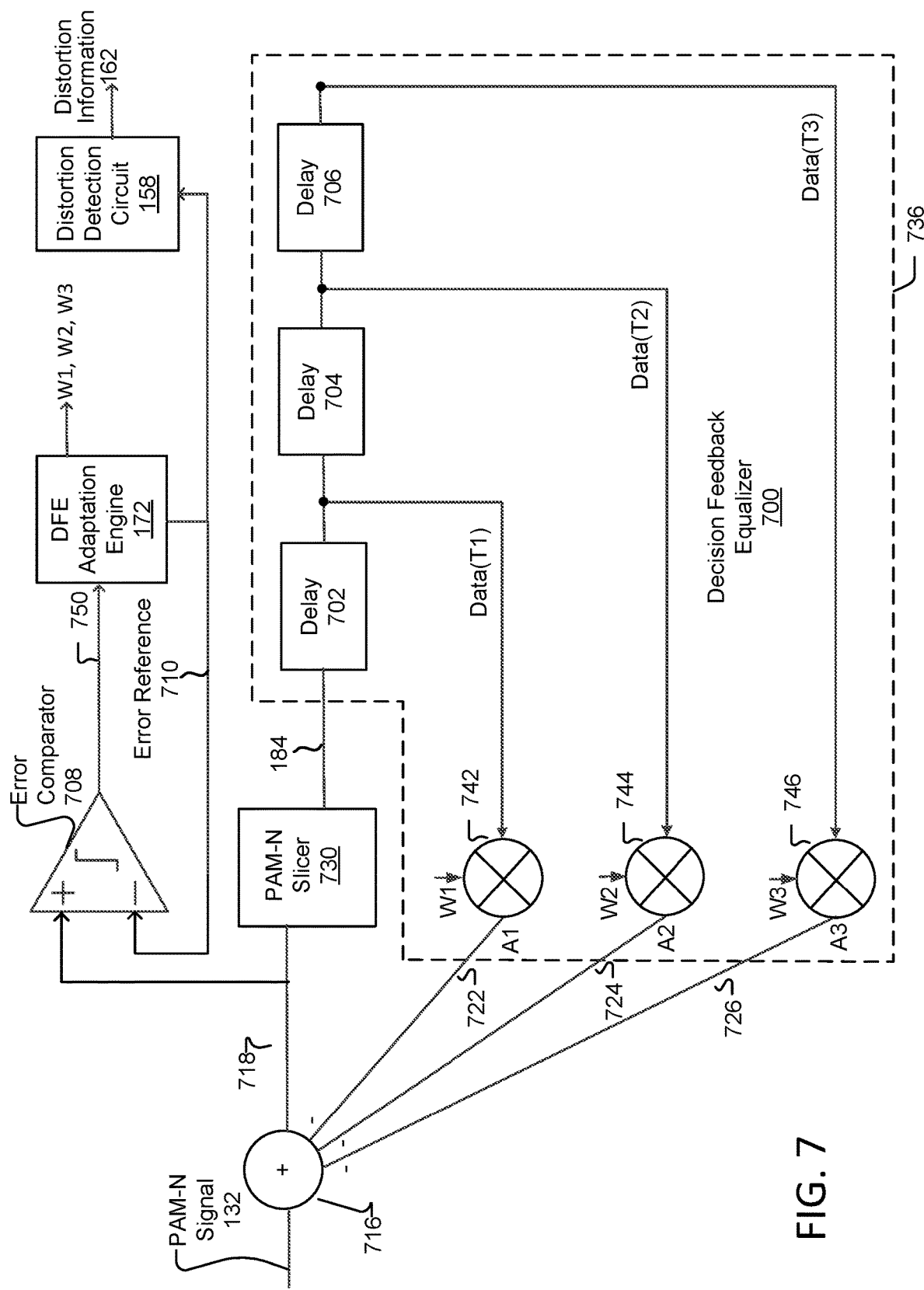
FIG. 7 illustrates an example method of detecting distortion in a PAM-N signal based on decision feedback equalizer (DFE) error level adaptation, according to an embodiment of the present disclosure.

FIG. 7 illustrates an example method of detecting distortion in a PAM-N signal based on DFE error level adaptation, according to an embodiment of the present disclosure. In this embodiment, the PAM-N receiving device 154 of FIG. 1 includes a DFE 700. The DFE 700, PAM-N slicer 730, and summer circuit 716 may be parts of the decision circuit 180. A DFE is a nonlinear equalizer that uses the feedback of detected symbols 184 to produce an estimate of the channel output. The DFE 700 is fed with detected symbols 184 and produces outputs 722, 724, and 726, which typically are subtracted from the PAM-N output signal 132 of the receiving circuit 172 of FIG. 1.

The DFE 700 includes DFE summing circuit 716, decision slicer circuit 730, and DFE tap DACs circuit 736. The DFE tap DACs circuit 736 includes multiple delay circuits, such as the three delay circuits 702, 704 and 706, to delay the data symbols 184. The output of delay circuit 702 is one feedback tap, the output of delay circuit 704 is another feedback tap, and the output of delay circuit 706 is another feedback tap. The DFE 700 compensates for ISI generated by previous received data symbols—Data(T1), Data(T2), and Data(T3). Each DFE weight W1, W2, and W3 is an estimation of the ISI contribution from the corresponding tap.

Tap weighting circuits 742, 744 and 746 weight the delayed data of each feedback tap by a tap weight W1, W2 and W3 and output weighted feedback signals 722, 724 and 726. In one embodiment, weighting circuits 742, 744 and 746 may be gain adjustable digital to analog converters (DAC) that convert the delayed data at each feedback tap into analog voltages. Summing circuit 716 subtracts the weighted feedback signals 722, 724 and 726 from the PAM-N signal 132. The summing circuit 716 then outputs a decision equalized signal 718 resulting from the combination of the weighted feedback signals 722, 724 and 726 and PAM-N signal 132.

The PAM-N decision slicer 730 makes a decision on the data symbols represented by the equalized signal 718, thereby generating recovered data symbols 184. The recovered data symbols 184 are PAM-N symbols. The data symbols 184 are passed on to other circuit stages (not shown) that use the data symbols 184. In one embodiment, for PAM-4 symbols, the PAM-N decision slicer 730 includes three separate slicing circuits that compare the equalized signal 718 to three separate decision reference voltages.

The DFE adaptation engine 172 is responsible for implementing an adaption algorithm that tunes the tap weights W1, W2, W3 of the DFE 700. The DFE adaption engine 172 can generate an error reference signal 710. The Error comparator 708 compares the decision equalized signal 718 to the error reference signal 710. Error comparator 708 outputs an error signal 750 indicating whether the differential voltage level of the decision equalized signal 718 is greater than or less than the error reference signal 710. For example, error signal 750 can include a binary value of 1 or 0 depending on the comparison. The error signal 750 is transmitted to the DFE adaptation engine 172, which iteratively adjusts the error reference signal 710 and the tap weights W1, W2 and W3 based on the error signal 750 using an adaptation algorithm. The DFE adaptation engine 172 may also receive and use the data symbols 184 and use the during the adaptation process.

During DFE error level adaptation, the error reference signal 710 is typically set by targeting one symbol at a time (e.g. 10, 11), and then adjusting the error reference signal 710 to a threshold error level while that symbol is being targeted. The DFE error level adaptation process typically results in the error reference signal 710 being set to a threshold error level that is close to the edge of a data eye. For example, referring to the data eye diagram 350 of FIG. 3, the error reference signal 710 can be set to 3 volts when targeting a "11" symbol, can be set to 1 volts when targeting a "10" symbol, can be set to −1 volts when targeting a "01" symbol and can be set to −3 volts when targeting a "00" symbol.

The error reference signal 710 is also transmitted by the DFE adaptation engine 172 to the distortion detection circuit 158, which generates the distortion information 162.

The distortion detection circuit 158 generates the distortion information 162 by determining a first threshold error level of the error reference signal 710 used to generate error information 750 for adaptation of tap weights W1, W2 and W3 of the DFE 700 when targeting a first symbol of the N symbols, e.g., digital value 11. The distortion detection circuit 158 determines a second threshold error level of the error reference signal 710 used to generate error information 750 for adaptation of the tap weights W1, W2 and W3 of the DFE 700 when targeting a second symbol of the N symbols, e.g., 10. The error levels used for DFE error level adaptation are correlated to the level differences 358A, 358B and 358C and can be used as an indication of distortion corresponding to inequality in voltage differences. For example, ideally, the error level when targeting a "11" symbol should be three times the error level when targeting a "10" symbol. However, if there is distortion, as shown in the data eye diagram 350 of FIG. 3, then the two error levels will not be three times each other.

The distortion information 162 is generated from the first threshold error level and the second threshold error level. In one embodiment, the distortion information 162 can be generated by calculating a ratio of the threshold error level for the "11" symbol to the ratio of the threshold error level for the "10" symbol. If the ratio of the threshold error level for the "11" symbol to the threshold error level for the "10" signal is more than three, this is in an indication that the level difference 358A is larger than the level difference 358B. Conversely, if the ratio of the threshold error level for the "11" symbol to the threshold error level for the "10" signal is less than three, this is in an indication that the level difference 358A is smaller than the level difference 358B. This information is used to output distortion information 162. Error levels targeting other symbols can be used to get information on the three level difference 358A, 358B, and 358C. Error levels are obtained in the process of conventional DFE error level adaptation in conjunction with proper data filtering.

Figure 8:
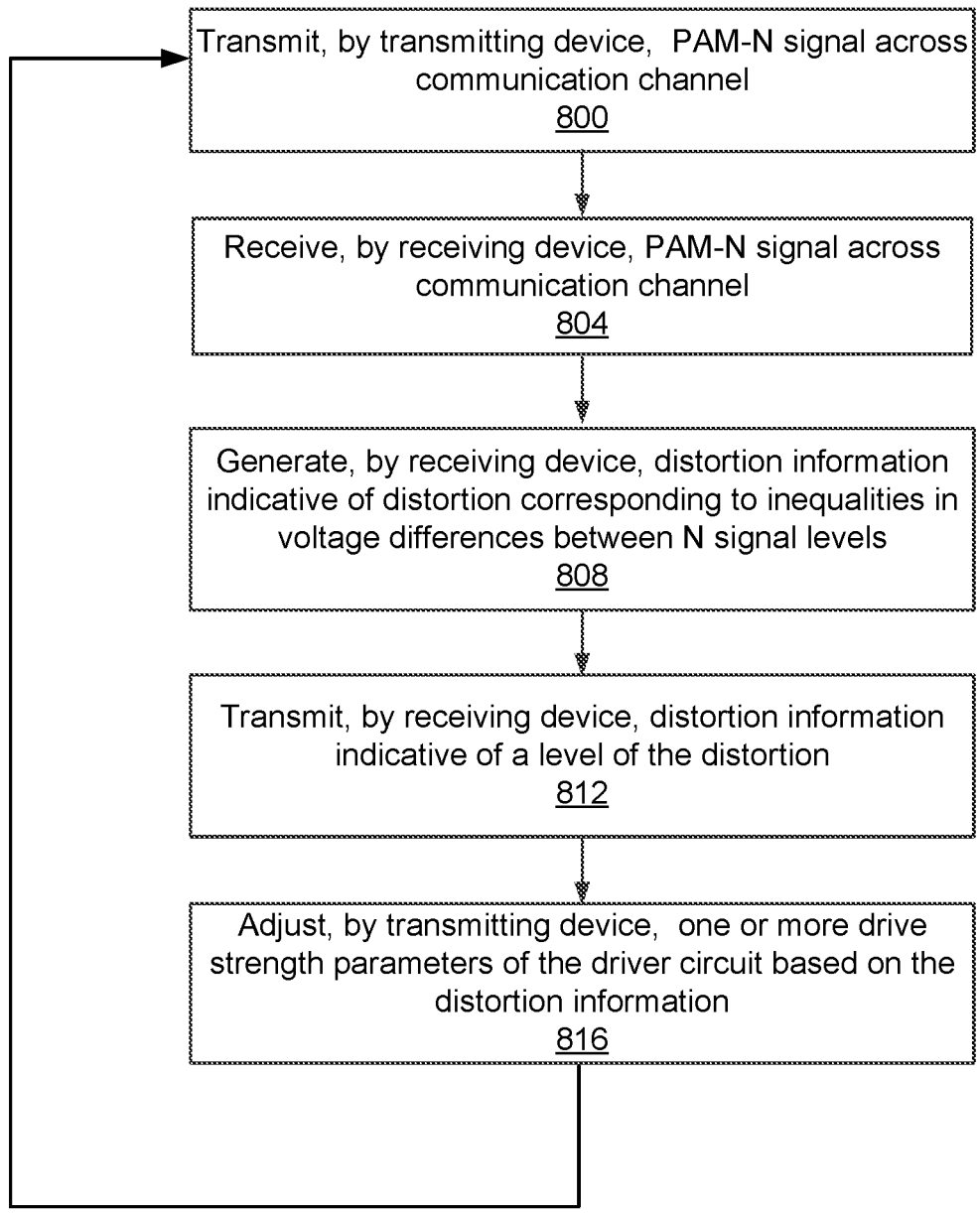
FIG. 8 is an example flowchart illustrating a method of receiver/transmitter co-calibration of voltage levels in PAM-N links, according to an embodiment of the present disclosure.

A Method of Receiver/Transmitter Co-Calibration of Voltage Levels in PAM-N Links FIG. 8 is an example flowchart illustrating a method of receiver/transmitter co-calibration of voltage levels in PAM-N links, according to an embodiment of the present disclosure. In some embodiments, the processes may have different and/or additional steps than those described in conjunction with FIG. 8. Steps of the processes may be performed in different orders than the order described in conjunction with FIG. 8. Some steps may be executed in parallel. Alternatively, some of the steps may be executed in parallel and some steps executed sequentially. Alternatively, some steps may execute in a pipelined fashion such that execution of a step is started before the execution of a previous step.

The PAM-N transmitting device 104 of FIG. 1, transmits 800 via the driver circuit 128, a PAM-N signal 132 via a communication channel 140. Here, N is greater than 2 and the PAM-N 132 signal has N signal levels corresponding to N symbols, e.g., 000, 001, 010, etc. The PAM-N receiving device, receives 804 via the receiver interface circuit 172, the PAM-N signal 176 (after voltage offset correction, etc., by the AFE 200). The distortion detection circuit 158 detects 808 the non-linear distortion corresponding to inequalities in voltage differences 358 between the N signal levels 354 within the PAM-N signal 176 and generates distortion information indicative of the level of the distortion.

The PAM-N receiving device 154 transmits 812, via the driver circuit 166 to the PAM-N transmitting device 104, the distortion information 162 indicative of a level of the distortion. The PAM-N transmitting device 104 receives, via the receiver interface circuit 108, the distortion information 162. The PAM-N transmitting device 104 adjusts 816, via the driver control circuit 116, one or more drive strength parameters of the driver circuit 128 of the PAM-N transmitting device 104 based on the distortion information 112.

In one embodiment, a representation of circuits within the receiver/transmitter calibration architecture may be stored as data in a non-transitory computer-readable medium (e.g. hard disk drive, flash drive, optical drive). These representations may in the form of, for example, behavioral level descriptions, register transfer level descriptions, logic component level descriptions, transistor level descriptions or layout geometry-level descriptions.

Upon reading this disclosure, those of skill in the art may appreciate still additional alternative designs for a system that includes a PAM-N transmitting device and a PAM-N receiving device. Thus, while particular embodiments and applications of the present disclosure have been illustrated and described, it is to be understood that the disclosure is not limited to the precise construction and components disclosed herein. Various modifications, changes and variations which may be apparent to those skilled in the art may be made in the arrangement, operation and details of the method and apparatus of the present disclosure herein without departing from the spirit and scope of the disclosure as defined in the appended claims.

What is claimed is:

1. A multi-level pulse amplitude modulation (PAM) PAM-N receiving device, comprising:
 a receiver interface circuit to receive a PAM-N signal from a PAM-N transmitting device via a communication channel, wherein N is greater than 2 and the PAM-N signal has N signal levels for N symbols;
 a circuit to generate distortion information indicative of a level of distortion corresponding to inequalities in voltage differences between the N signal levels; and
 a driver circuit to transmit the distortion information indicative of the level of the distortion to the PAM-N transmitting device.

2. The PAM-N receiving device of claim 1, further comprising:
 a decision feedback equalizer, wherein the distortion information is generated by:
  determining a first threshold error level used to generate error information for adaptation of tap weights of the decision feedback equalizer when targeting a first symbol of the N symbols, and
  determining a second threshold error level used to generate error information for adaptation of the tap weights of the decision feedback equalizer when targeting a second symbol of the N symbols, wherein the distortion information is generated from the first threshold error level and the second threshold error level.

3. The PAM-N receiving device of claim 1, wherein the distortion information is generated by:
 identifying a first amount of inter symbol interference (ISI) during transitions from a first symbol of the N symbols; and
 identifying a second amount of ISI during transitions from a second symbol of the N symbols, wherein the distortion information is generated from the first amount of ISI and the second amount of ISI.

4. The PAM-N receiving device of claim 3, wherein the circuit:
 identifies the first amount of ISI during transitions from the first symbol to a third symbol of the N symbols; and
 identifies the second amount of ISI during transitions from the second symbol to a fourth symbol of the N symbols.

5. The PAM-N receiving device of claim 1, wherein the circuit comprises:
 an eye scanning circuit to detect a plurality of vertical eye openings for the PAM-N signal, wherein the distortion information is generated from the plurality of vertical eye openings.

6. The PAM-N receiving device of claim 1, wherein:
 the circuit detects when a predetermined pattern is present in the PAM-N signal and generates the distortion information responsive to the predetermined pattern being present.

7. The PAM-N receiving device of claim 1, wherein:
 the receiver interface circuit comprises an analog front end circuit that applies analog signal conditioning to the PAM-N signal; and
 the circuit generates the distortion information indicative of the level of distortion corresponding to the inequalities in the voltage differences between the N signal levels in the PAM-N signal at an output of the analog front end circuit.

8. A multi-level pulse amplitude modulation (PAM) PAM-N transmitting device, comprising:
 a driver circuit to transmit a PAM-N signal via a communication channel to a PAM-N receiving device, wherein N is greater than 2, and the PAM-N signal has N signal levels for N symbols;
 a receiver interface circuit to receive distortion information indicative of a level of distortion corresponding to inequalities in voltage differences between the N signal levels at the PAM-N receiving device; and
 a driver control circuit to adjust one or more drive strength parameters of the driver circuit based on the distortion information.

9. The PAM-N transmitting device of claim 8, wherein:
 the driver circuit generates the PAM-N signal using a predetermined pattern.

10. The PAM-N transmitting device of claim 8, wherein:
 the driver circuit generates the PAM-N signal using a pseudorandom or scrambled pattern.

11. The PAM-N transmitting device of claim 8, wherein the driver circuit includes:
 a first driver corresponding to a first symbol bit; and
 a second driver corresponding to a second symbol bit,
 wherein the driver control circuit adjusts the one or more drive strength parameters based on the distortion information such that a ratio of a first drive strength of the first driver to a second drive strength of the second driver is adjusted.

12. The PAM-N transmitting device of claim 8, wherein the driver control circuit adjusts the one or more drive strength parameters to minimize the inequalities in the voltage differences.

13. The PAM-N transmitting device of claim 8, wherein the driver control circuit adjusts the one or more drive strength parameters to match a peak power constraint of the driver circuit.

14. A method, comprising:
 transmitting, by a driver circuit of a multi-level pulse amplitude modulation (PAM) PAM-N transmitting device, a PAM-N signal via a communication channel, wherein N is greater than 2, and the PAM-N signal has N signal levels corresponding to N symbols;
 receiving, by a PAM-N receiving device, the PAM-N signal;
 generating, by the PAM-N receiving device, distortion information indicative of a level of distortion corresponding to inequalities in voltage differences between the N signal levels;
 transmitting, by the PAM-N receiving device to the PAM-N transmitting device, the distortion information indicative of the level of the distortion;
 receiving, by the PAM-N transmitting device, the distortion information; and
 adjusting, by the PAM-N transmitting device, one or more drive strength parameters of the driver circuit of the PAM-N transmitting device based on the distortion information.

15. The method of claim 14, wherein the generating of the distortion information comprises:

determining a first threshold error level used to generate error information for adaptation of tap weights of a decision feedback equalizer when targeting a first symbol of the N symbols; and determining a second threshold error level used to generate error information for adaptation of the tap weights of the decision feedback equalizer when targeting a second symbol of the N symbols, wherein the distortion information is generated from the first threshold error level and the second threshold error level.

16. The method of claim 14, wherein the generating of the distortion information comprises:

identifying a first amount of inter symbol interference (ISI) during transitions from a first symbol of the N symbols; and identifying a second amount of ISI during transitions from a second symbol of the N symbols, wherein the distortion information is generated from the first amount of ISI and the second amount of ISI.

17. The method of claim 16, wherein the generating of the distortion information comprises:

identifying the first amount of ISI during transitions from the first symbol to a third symbol of the N symbols; and identifying the second amount of ISI during transitions from the second symbol to a fourth symbol of the N symbols.

18. The method of claim 14, wherein the generating of the distortion information comprises:

detecting a plurality of vertical eye openings for the PAM-N signal, wherein the distortion information is generated from the plurality of vertical eye openings.

19. The method of claim 14, further comprising:

detecting a predetermined pattern being present in the PAM-N signal; and generating the distortion information responsive to the predetermined pattern being present.

20. The method of claim 14, further comprising:

applying, by an analog front end circuit, analog signal conditioning to the PAM-N signal;

wherein the distortion information is generated to indicate a level of distortion corresponding to the inequalities in the voltage differences between the N signal levels in the PAM-N signal at an output of the analog front end circuit.

* * * * *